United States Patent [19]

du Parc

[11] Patent Number: 4,489,373
[45] Date of Patent: Dec. 18, 1984

[54] NON-DISSIPATIVE LC SNUBBER CIRCUIT

[75] Inventor: Jacques G. M. du Parc, Neuilly-Plaisance, France

[73] Assignee: Societe Nationale Industrielle Aerospatiale, France

[21] Appl. No.: 448,016

[22] Filed: Dec. 8, 1982

[30] Foreign Application Priority Data

Dec. 14, 1981 [FR] France ............................. 81 23292

[51] Int. Cl.³ ......................................... H02H 7/122
[52] U.S. Cl. ................................... 363/56; 363/124; 363/134
[58] Field of Search ................... 363/50, 56, 124, 134; 323/289; 361/91, 111; 318/345 B

[56] References Cited

U.S. PATENT DOCUMENTS

| 4,093,877 | 6/1978 | Pollmeier | 323/289 |
| 4,167,776 | 9/1979 | Nygaard | 363/56 |
| 4,336,587 | 6/1982 | Boettcher et al. | 363/56 |
| 4,365,171 | 12/1982 | Archer | 361/91 |
| 4,370,701 | 1/1983 | Western | 363/56 |

FOREIGN PATENT DOCUMENTS

| 2639589 | 3/1978 | Fed. Rep. of Germany . |
| 2649385 | 3/1978 | Fed. Rep. of Germany . |
| 2014805 | 8/1979 | United Kingdom | 363/56 |

OTHER PUBLICATIONS

Proceedings of the Seventh National Solid-State Power Conversion Conference, pp. G4-1 to 9, Shaughnessy, "Modelling and Design of Non-Dissipative LC Snubber Networks", Mar. 1980.
Proceedings of the Sixth National Solid-State Power Conversion Conference, pp. B1-1 to 6, Whitcomb, "Designing Non-Dissipative Current Snubbers for Switched Mode Converters", May 1979.

Primary Examiner—William H. Beha, Jr.
Attorney, Agent, or Firm—Marshall, O'Toole, Gerstein, Murray & Bicknell

[57] ABSTRACT

Non-dissipative snubber for a D.C. power switching circuit comprising a main inductance connected in series with a load, a controlled switch, an inductance, and a D.C. voltage source. The snubber includes a branch circuit including a capacitor, a first diode, and an auxiliary inductance in series, mounted in parallel across the switch, with one terminal of the capacitor directly connected to the junction of the switch and the main inductance. The other terminal of the capacitor is connected through a second diode to a point of constant potential having a value about half that withstood by the switch. The snubber permits the use of a capacitor of lower voltage rating than heretofore required.

6 Claims, 8 Drawing Figures

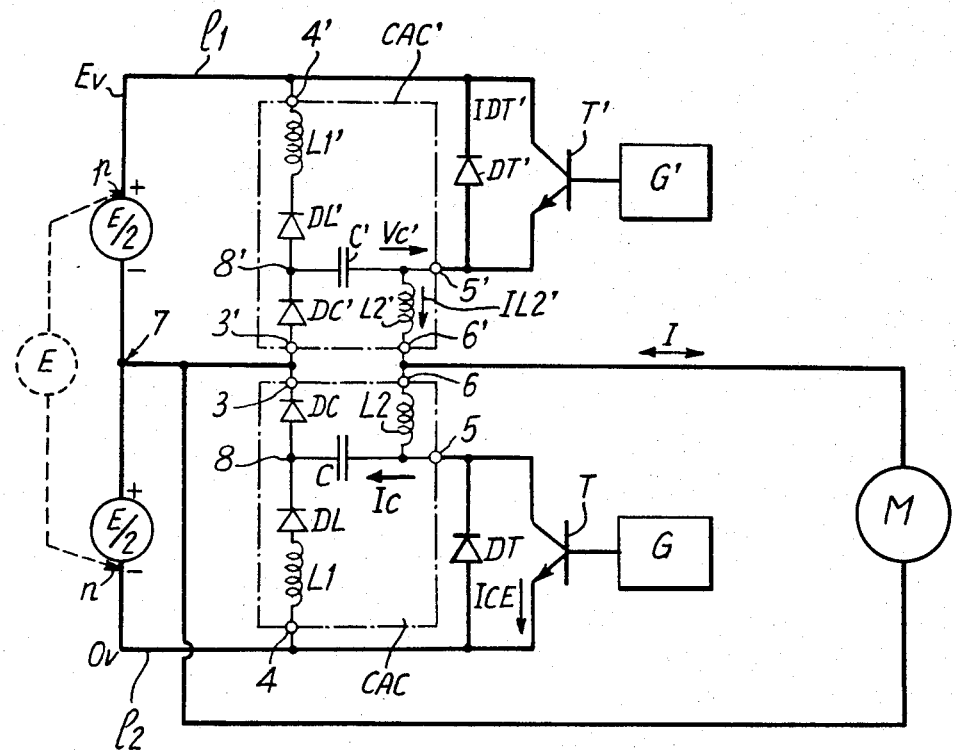
Fig:4
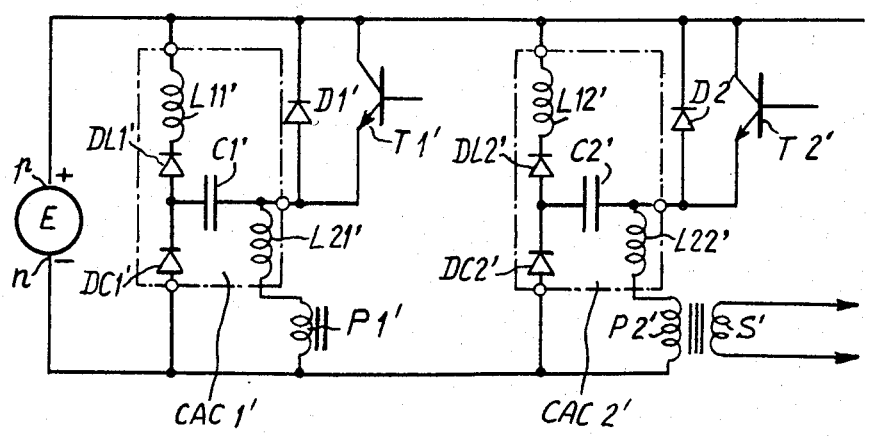
Fig:7

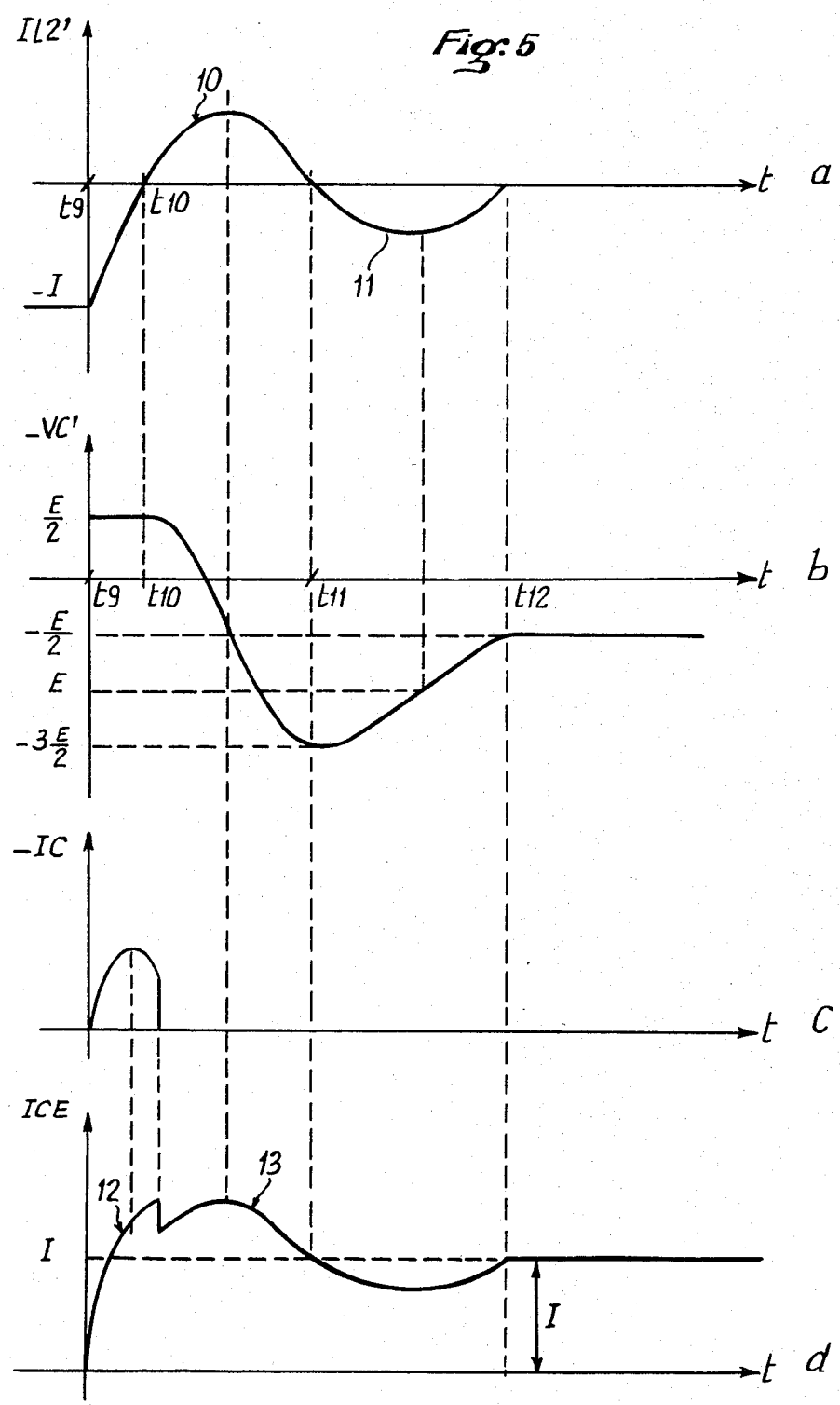

NON-DISSIPATIVE LC SNUBBER CIRCUIT

The present invention relates to electrical switching devices associated with a D.C. source and provided with at least one controlled switch, as well as to a switching aid circuit for such a switching device.

It is more particularly, but not exclusively, applied to switching devices of symmetrical structure, comprising at least two controlled switches and therefore two switching aid circuits, and in particular to converters of the push-pull type.

It is known that such switching devices, for example static inverters with chopping, use, as switch, either components such as diodes, thyristors, transistors, etc., or overall equivalent assemblies of components. Thus, in the present specifications, the term "switch" is generally understood to mean a dipole transiting an electrical power and capable of taking two states alternately, namely a conductive state for which the voltage at the terminals of the dipole is very low or zero and the current passing through the dipole is imposed by an outside electrical circuit, and a blocked state for which the current passing through the dipole is very low or zero and the voltage at the terminals of the dipole is imposed by said outside circuit.

Furthermore, the change of state of a switch is known to be accompanied by "switching losses", which are all the more considerable as the switching time is less negligible. In fact, during a change of state, the voltage and the current are simultaneously and transitorily high. In a system of voltage-current axes, the dipole thus presents a characteristic which depends on its intrinsic properties and on the outside circuit.

Of course, the switching losses upon opening (passage from the conductive state to the blocked state) are distinguished from the switching losses upon closure (passage from the blocked state to the conductive state), the power of these losses being proportional to the repetition frequency of the switchings.

Moreover, certain switches are fragile and withstand the conditions of voltage and of current occurring during or after the switching with difficulty, this either limiting the performances of the switching device or being detrimental to the life of said switches. Furthermore, it will be noted that the placing of switches in parallel or in series, to increase the switched power, almost always proves to be dangerous at the moment of the switchings, due to the dispersion of the inner characteristics of the various switches; in particular, if one switch switches before the others, it must withstand all the voltage or all the work current for a short instant.

In order to overcome the above drawbacks (switching losses, fragility of the switches and difficulty in placing switches in parallel or in series), it is known to associate with the switches switching aid circuits (or networks), also called switching protection circuits or snubbers. The effect of these switching aid circuits is to modify the opening and closure characteristics withstood by the switches.

Such switching aid circuits may be active or passive. The present invention is concerned only with the passive aid circuits, i.e. constituted by passive components, but ensuring protection of the switch associated both with opening and with closure. It enables switching of devices which are particularly difficult to protect, namely converters or symmetrical static inverters requiring at least two alternately controlled switches, to be aided.

In known switching aid circuits, of passive type, at least one capacitor is provided for absorbing the opening over-voltage and at least one inductance for absorbing the closure over-current. These known circuits generally require a large number of components and are not easily adapted to devices of symmetrical structure. Moreover, the capacitor must be overdimensioned or doubled as it must withstand the same voltage as the switch, at the moment of switching.

The present invention relates to a passive switching aid circuit, or snubber, of this type, not comprising any resistor (and therefore non-dissipative), using only a few passive components and in particular only one capacitor withstanding a voltage less than that withstood by the switch.

With respect to the known devices, there is a saving on the components and therefore a saving in costs and increase in reliability.

To this end, according to the invention, the switching device of a source of D.C. voltage adapted to supply a load with which is associated at least one free wheel diode, this device comprising at least one controlled switch as well as a passive and non-dissipative switching aid circuit, or snubber, provided with at least one main inductance adapted to protect the controlled switch during closure thereof and a capacitor adapted to protect the latter during opening thereof, is noteworthy in that said main inductance is directly connected in series with said controlled switch, in that one branch of circuit comprising the series-assembly a capacitor, a first diode and an auxiliary inductance, is mounted in parallel on said controlled switch so that a terminal of said capacitor is connected to the point common to said controlled switch and to said main inductance, in that the other terminal of said capacitor is connected, via a second diode, to a point having a potential which is substantially fixed and greater or lower than the potential applied by said source to the end of the controlled switch opposite said main inductance, according to whether this latter potential is negative or positive respectively, and in that said first and second diodes are blocking for the D.C. voltage applied to the terminals of the branch of circuit comprising said diodes and said auxiliary inductance in series.

It is thus seen that, in the device according to the invention, the capacitor withstands an alternately positive and negative voltage of value half the one-way voltage withstood in the case of the known devices. This results in that the capacitor may be unique and of normal working voltage (without over-dimensioning). Thus, the circuit according to the invention may comprise only one capacitor, two diodes and two inductances.

As will be seen hereinafter in greater detail, upon opening, the overvoltage due to the discharge of the main inductance is absorbed by the capacitor, the second diode then being conductive, whilst, upon closure, the over-current due to the discharge of the capacitor is absorbed by the inductance which is in series via the first diode. Thus, by choosing the capacity of the capacitor and the values of the two inductances, it is possible advantageously to fix the compromise upon opening between the minimum opening time necessary for the discharge of the main inductance and the overvoltage due to this discharge and the compromise upon closure between the minimum closure time necessary for the discharge of the capacitor and the over-current due to this discharge.

Said point of fixed potential to which the capacitor is connected by the second diode is preferably such that its potential corresponds to half the voltage withstood by the switch. Thus, in the push-pull converters, said point of fixed potential is the terminal of the D.C. source opposite the terminal to which is connected the end of the controlled switch opposite the main inductance. Furthermore, in the other converters, this point of fixed potential is constituted by the centre point of said source. This centre point may either exist naturally (in the case of a double-source converter, for example), or be specially made, for example with the aid of capacitors, for carrying out the present invention.

In the event of the switching device according to the invention comprising, in its structure, a transformer, it is advantageous to use the leakage inductances of this transformer to make said main inductance. A drawback is therefore converted into an advantage.

Of course, when, as is usually the case, an improved switching device according to the invention comprises a plurality of controlled switches, there is associated with each of them a switching aid circuit, or snubber, comprising said capacitor, said first and second diodes, the main inductance and the auxiliary inductance and each of these switches is disposed in the described manner.

The invention will be more readily understood on reading the following description with reference to the accompanying drawings, in which:

FIG. 1 shows a simple switching device according to the invention.

Diagrams a to h of FIG. 2 illustrate the working of the device of FIG. 1.

FIG. 4 shows a switching device according to the invention, of symmetrical structure.

Diagrams a to d of FIG. 5 illustrate part of the working of the device of FIG. 4.

Figure 6:
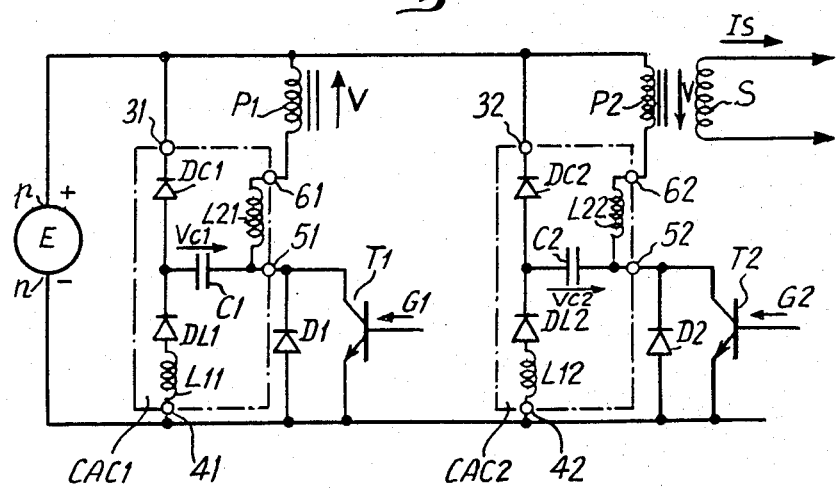

FIG. 6 illustrates the application of the invention to a converter of push-pull structure.

FIG. 7 shows another push-pull converter structure to which the invention is applied.

Figure 8:
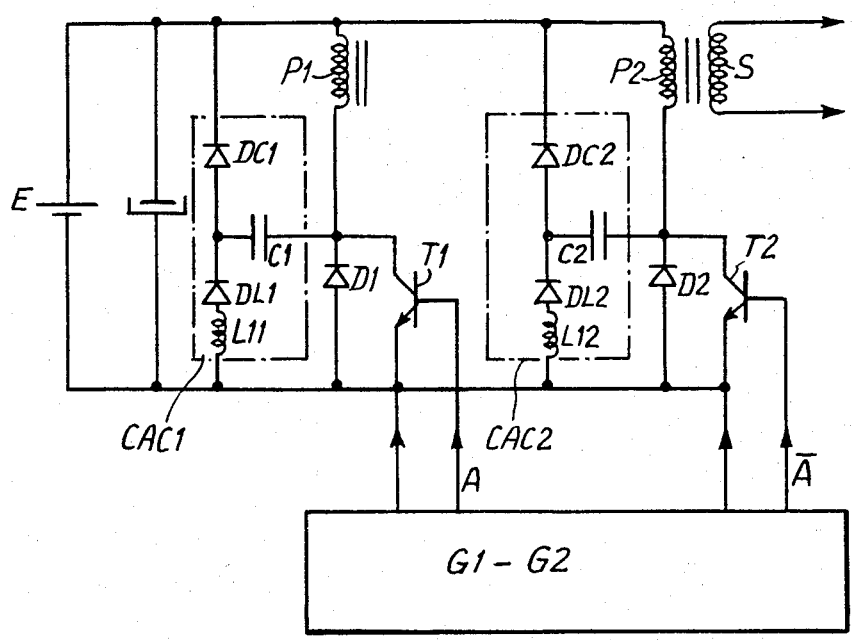

FIG. 8 shows a variant of the device of FIG. 6, in which said main inductances are replaced by the leakage inductances between the primary windings.

Referring now to the drawings, the switching aid circuit according to the invention, hereinafter referred to as snubber, shown in FIG. 1, where it bears reference CAC, is illustrated applied to an inverter of known type adapted to supply a charge, for example an electric motor M. This inverter comprises a controlled switch T, for example a power transistor whose conduction is controlled by pulses emitted by a generator G and applied to the base of said transistor. The switch T makes it possible to chop the D.C. voltage of a source E, at the frequency of the control pulses of generator G and to supply the motor M with these chopped pulses. The diode D at the terminals of the load M serves as free wheel diode.

To this end, the positive pole p of the source E is connected to the point 1 common to the cathode of the diode D and to the positive terminal of the motor M by a line $l_1$, whilst the negative pole n of source E is connected to the point 2 common to the anode of the diode D and to the negative terminal of motor M by a line $l_2$, the switch T being interposed in line $l_2$.

The circuit CAC is connected to the inverter at four terminals 3, 4, 5 and 6. The terminal 3 is connected to a centre point 7 subdividing the source E into two identical half sources E/2, whilst terminal 4 is connected to line $l_2$, between the negative pole n and the switch T. The terminals 5 and 6 connected when the circuit CAC does not exist, are disposed in link $l_2$, between the switch T and point 2, and interrupt this link $l_2$ when the circuit CAC exists.

The circuit CAC comprises, between the terminals 5 and 3, the series-assembly of a capacitor C and of a diode DC and, between the terminal 4 and the point 8 common to the capacitor C and to the diode DC, the series-assembly of an inductance L1 and of a diode DL. An inductance L2 connects the terminals 5 and 6.

Thus, the circuit CAC is such that the inductance L2 is mounted in series between the load M and the transistor T and that a branch circuit comprising the series-assembly of a capacitor C, the diode DL and the inductance L1 is mounted in parallel on the emitter-collector path of the transistor T, so that one terminal of the capacitor C is connected to the end of the inductance L2 directed towards the transistor T and that the other terminal of the capacitor C is connected to point 7 of potential $+(E/2)$ half the voltage E withstood by the switch T, via the diode DC, the diodes DL and DC being blocking for the voltage E/2 applied to the terminals of the branch of circuit comprising the diodes DL and DC and the inductance L1 in series.

The circuit CAC does not comprise any resistor and it is therefore not dissipative.

Figure 1:
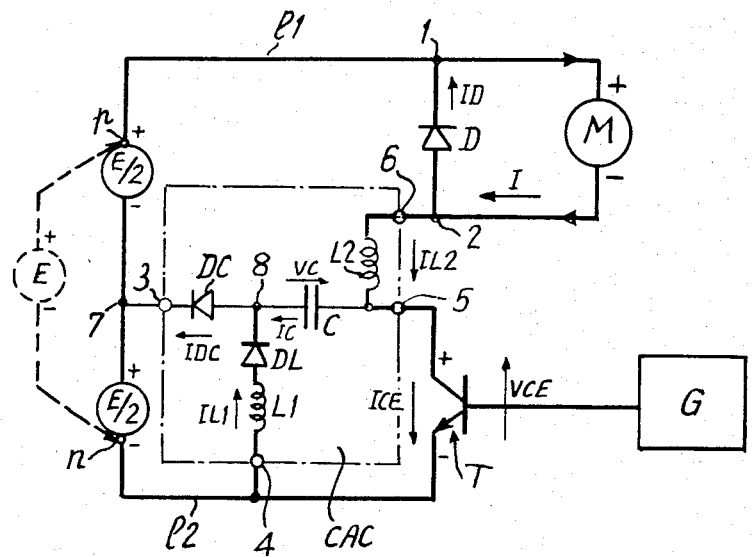
Figure 2:
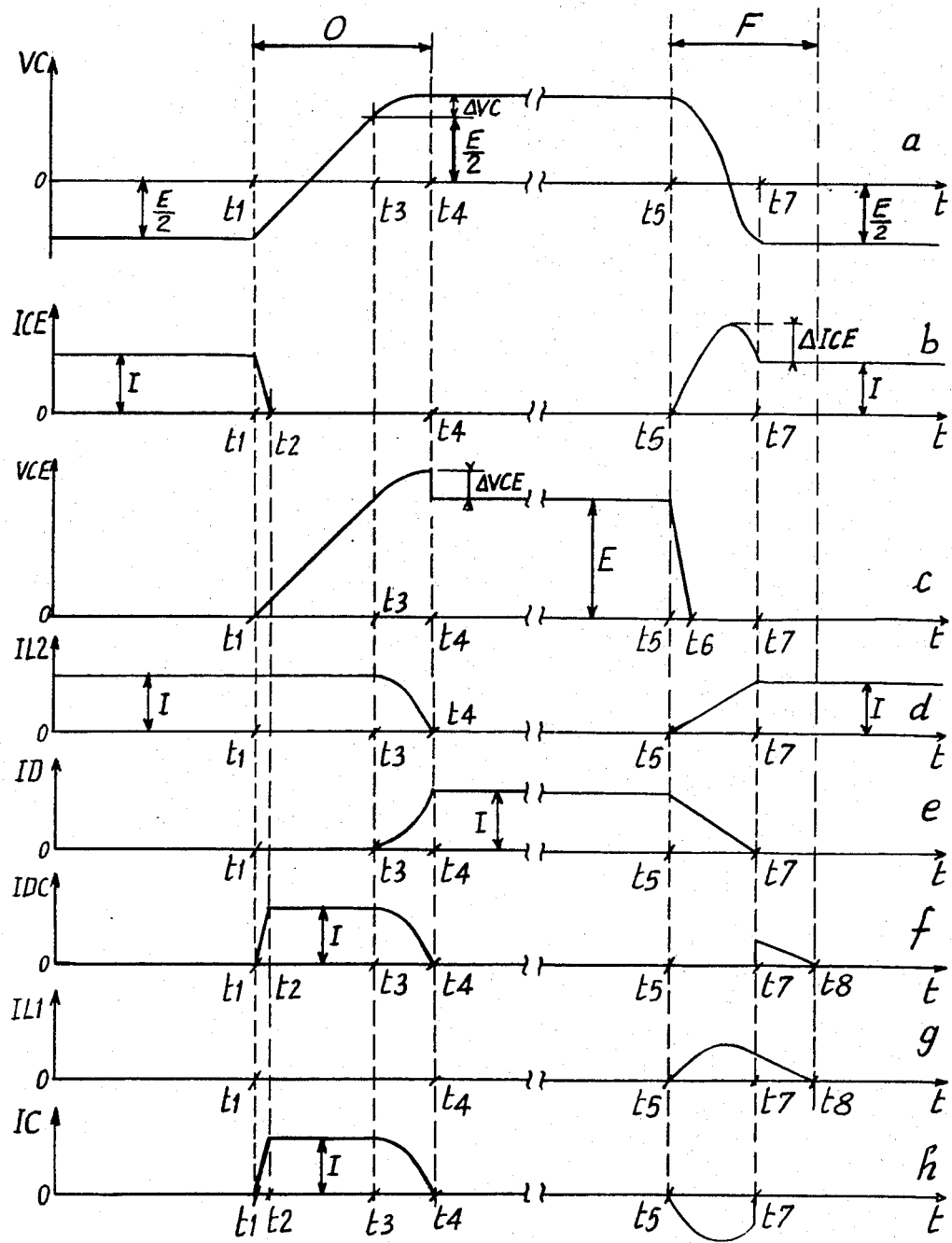

The working of the switching aid circuit, or snubber, CAC of FIG. 1 is illustrated by the diagrams of FIG. 2 which show as a function of time t, the evolution of different electrical parameters of this circuit. In the diagrams of FIG. 2, it has been assumed that the switch T was closed from O to $t_1$, that it was opened at $t_1$ and that it was reclosed at $t_5$, the opening O of the circuit being effected from $t_1$ to $t_4$, whilst closure F extends from $t_5$ to $t_8$.

In the initial state, i.e. when the switch T is closed (between O and $t_1$), the current ICE of the collector-emitter path of the transistor T and the current IL2 passing through the inductance L2 are equal to the current I passing through the load M (cf. FIGS. 2b and 2d). The voltage VC at the terminals of the capacitor C is then equal to $-(E/2)$ (FIG. 2a) as will be verified subsequently. During this initial state, only the transistor T is conductive, the diodes D, DC and DL being blocked.

The opening O of the circuit (from $t_1$ to $t_4$) is broken down into three periods:

from $t_1$ to $t_2$, the transistor T remains conductive, but as it has a considerable intrinsic cut-off power, it imposes the rapid drop of its current ICE which passes from value I to value 0 (FIG. 2b). Correlatively, the capacitor C, of which the voltage at the terminals VC becomes less negative, prevents any sudden increase in the voltage VCE (FIG. 2c) at the terminals of the transistor T and the diode DC becomes conductive. Consequently, the current IDC which passes therethrough is equal to the charge current IC of the capacitor C and the currents IDC and IC pass concomitantly from value 0 to value I (FIGS. 2f and 2h), in the direction opposite to current ICE, so as to maintain the equality IC+ICE=I=IL2.

It is assumed that the capacity of the capacitor C is sufficiently large for the variation of the voltage VC to remain negligible, with the result that the time slot $t_2-t_1$ is negligible with respect to $t_3-t_1$ and that the switching losses upon opening which are equal $$\int_{t_1}^{t_2}$$

$VCE \times ICE \times dt$ remain very low.

from $t_2$ to $t_3$, the transistor T is extinguished and the free wheel diode D is not yet conductive, with the result that only diode DC is conductive (DL always being blocked). The charge M maintains the equality $IDC=IC=IL3=I$. The voltage at the terminals of the inductance L2 is zero and the capacitor C is charged linearly (cf. VC in FIG. 2a). The voltage at the terminals of the free wheel diode D, which is equal to $VC-(E/2)$, remains negative but increases with VC and, at instant $t_3$ for which $VC=(E/2)$, it becomes zero. The diode D is therefore energized.

from $t_3$ to $t_4$, the diodes D and DC are therefore conductive, whilst transistor T and diode DL are blocked. The current ID passing through diode D increases from 0 to I (cf. FIG. 2e), whilst the currents IDC, IC and IL2, which are equal, decrease from 1 to 0. This decrease is such that the equality $I=ID+IL2$ is maintained. As shown by the different diagrams of FIG. 2, the law of variation of the voltages and currents is no longer linear, but corresponds to a portion of the period of the oscillating circuit formed by L2, C, DC, E/2 and D, with for initial conditions a zero voltage (at instant $t_3$ the voltage VC is compensated by the source E/2) and a non-zero current I.

Instant $t_4$ corresponds to the end of opening, marked by the blocking of the diode DC and overvoltages $\Delta VCE$ and $\Delta VC$ appearing respectively at the terminals of the transistor T and of capacitor C. The overvoltage $\Delta VCE$ disappears suddenly, whilst the overvoltage $\Delta VC$ (above $+(E/2)$ is maintained due to the discharge of the inductance L2. This over-voltage $\Delta VC$ is equal to $$I\sqrt{\frac{L2}{C}}.$$

After instant $t_4$, the circuit is in an intermediate state lasting up to instant $t_5$. In this intermediate state, the transistor T and diodes DC and DL are blocked and only the free wheel diode D is conductive. The voltage VC remains greater than $+(E/2)$, whilst the voltage VCE is equal to E. The charge current I flows in free wheel through diode D.

The closure F of the circuit (from $t_5$ to $t_8$) may also be broken down into three periods:

from $t_5$ to $t_6$, the transistor T is energized, with the result that the voltage VCE passes quickly from E to O, the consequence of which is to render the diode DL conductive and to maintain the diode DC blocked. The inductances L1 and L2 therefore limit the growth of current ICE. These inductances L1 and L2 are assumed to be sufficiently high for the growth of ICE still to be negligible at instant $t_6$, so that the time slot $t_6-t_5$ is also negligible before slot $t_7-t_5$. The switching losses upon opening which are equal to $$\int_{t_5}^{t_6}$$

$VCE \times ICE \times dt$ are therefore very low.

from $t_6$ to $t_7$, only diode DC is blocked. The voltage VCE is zero and the current ICE passing through the transistor T is the sum of the currents passing through the inductances L1 and L2: $ICE=IL1+IL2$, current IL1 being equal to $-IC$. The current IL2 increases linearly from 0 to I, whilst ID decreases linearly from I to 0 with $ID+IL2=1$. The current $IL1=-IC$ is, for its part, sinusoidal, as it comes from the series oscillating circuit L1—C (DL and T are then short-circuits) having for initial conditions a zero current and a voltage VC greater than E/2. The diode DC finishes by being unblocked, as it withstands a cathode-anode voltage equal to $VC+(E/2)$, now, VC which was greater than E/2 at instant $t_5$ tends to be inverted due to the oscillation. The diode DC becomes unblocked at instant $t_7$, at which voltage VC attains value $-(E/2)$.

The diode D may be blocked before or after the diode DC is energized. For simplification purposes, it has been assumed in FIG. 2 that the two events occurred at the same instant $t_7$.

The over-intensity $\Delta ICE$ passing through the transistor T is then equal to $$\left[\frac{E}{2} \pm I\sqrt{\frac{L2}{C}}\right]\sqrt{\frac{C}{L1}}$$

from $t_7$ to $t_8$, only diode D is blocked. At instant $t_7$, the current IL1 tips suddenly from capacitor C towards diode DC so that $IC=O$ and $IDC=IL1$. The inductance L1 finishes by discharging in source E according to a linear law. Furthermore, the free wheel diode D is blocked, the current IL2 remains constant and equal to I. At instant $t_8$, the current IL1 becomes zero. The two diodes DC and DL are blocked and the initial state is resumed.

Figure 3:
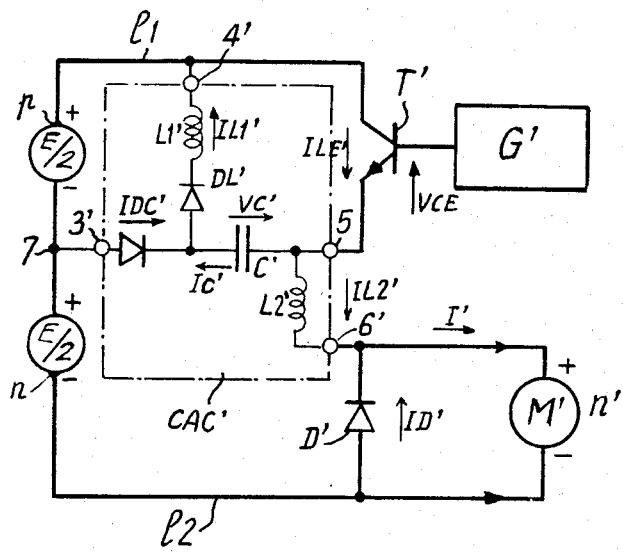
FIG. 3 illustrates a variant of the device of FIG. 1.

FIG. 1 illustrates the invention in the event of the load M being upstream of the switch T, with respect to the direction of circulation of the charge current I. FIG. 3 illustrates the case of the switch T′ being upstream of load M′. In this Figure, the elements corresponding to FIG. 1 are followed by a prime.

The circuit CAC′ of FIG. 3 presents a structure similar to circuit CAC, except that the diodes DC′ and DL′ are in opposite direction, so as to be blocking for the part of source E/2 on which the branch DC′, DL′, L1′ is mounted in parallel. In fact, now, the terminal 4′ is located on line $1_1$, between the pole p and the switch T′.

In the device of FIG. 3, the inductance L2′ is also mounted in series between the load M′ and the transistor T′ and the branch of circuit comprising the series assembly of the capacitor C′, the diode DL′ and the inductance L1′ is mounted in parallel on the transistor T′, so that one terminal of capacitor C′ is connected to the end of the inductance L2′ directed towards the transistor T and that the other terminal of capacitor C′ is connected to the point 7 of potential $+(E/2)$ half of the voltage E withstood by the switch T′, via the diode DC′.

The working of circuit CAC′ is identical to that of circuit CAC explained with regard to FIG. 2.

FIG. 4 illustrates a converter of symmetrical structure enabling a single load M to be supplied alternately with positive and negative pulses. This converter comprises a D.C. source E subdivided into two half-sources E/2, having a common point 7. In the line starting from pole p is interposed a transistor T', actuated by a generator G'. An aid circuit CAC' is provided, whose terminal 4' is connected to line $l_1$, between pole p and transistor T', whilst terminals 3' and 5' are respectively connected to point 7 and to the end of the transistor T' opposite pole p.

Similarly, in line $l_2$ starting from pole n is interposed a transistor T, actuated by a generator G. A snubber circuit CAC is mounted so that its terminal 4 is connected to line $l_2$, between pole n and transistor T, whilst the terminals 3 and 5 are respectively connected to point 7 and to the end of the transistor T opposite pole n.

The load M is supplied between point 7 and the terminals 6 and 6' connected to each other. Free wheel diodes DT and DT' are respectively mounted in anti-parallel on transistors T and T'.

Transistors T and T' are controlled alternately upon opening and upon closure by generators G and G', so that the load current I passing through charge M alternately changes direction.

To explain the working of the device of FIG. 4, a switching cycle will be studied, during which the transistor T is controlled, transistor T' always remaining open. Of course, the switch cycle for which transistor T' is controlled, whilst transistor T remains open, works in identical manner. It will be noted that the real working of the device of FIG. 4 is extremely complicated and that the following explanation is only a simplification thereof intended only to enable the invention to be understood.

In the initial state, it is therefore assumed that the transistor T is conductive, whilst all the other transistors and diodes are blocking. The load current I (which is then assumed to be negative) therefore flows through the inductance L2 and the transistor T, from load M towards the negative pole n of the source E. Consequently, the potentials V5', V5, V6 and V6' respectively of terminals 5', 5, 6 and 6' are equal to that of pole n, i.e. zero. Furthermore, due to the diodes DC' and DL', the potential V8' of point 8' is between E/2 and E.

This therefore results in that the voltage VC' at the terminals of the capacitor C' is included between E/2 and E. In comparable manner, due to the diodes DC and DL, the potential V8 of the point 8 is between O and E/2, so that the voltage VC at the terminals of the capacitor C is between −E/2 and 0. In fact, VC is equal to −E/2, as the diode DC was conductive at the end of the preceding switching (closure of T) to assure discharge of L1. This value is moreover necessary to assure protection of T upon opening.

When the transistor T opens, its current ICE is suddenly cancelled, with the result that the charge current I flows through the inductance L2, the capacitor C and the diode DC, which discharges the capacitor C and raises the potentials V5=V5'=V6=V6' and therefore also potential V8'. When potential V8' reaches value E, the diode DL' becomes conductive; at that instant, E=V8'=E/2+VC+VC', VC' remaining unchanged. From that instant, the current I is divided through two circuits in parallel, namely circuit L2, C and DC and circuit L2', C', DL' and L1'. The current I being constant, $dIL2/dt$ is equal to $dIL2'/dt$ and V6=V6'=(V5+V5')/2. There are then several possibilities of working depending on the order in which the extinctions of DC and of DL' and the energization of DT' are produced. In addition, V5'=E may also be imposed by energizing the transistor T', in more or less delayed manner. The effect of this is to accelerate growth of the voltages and to reduce the overall opening time, especially when the current I is weak. A brief oscillation current passes through the transistor T'. Finally, depending on the case, diodes DC' and DL may conduct briefly at the end of the opening cycle.

At the end of opening of transistor T, an intermediate state is therefore attained in which diode DT' is conductive, whilst all the other transistors or diodes are blocked. The current I then flows through inductance L2' and diode DT'. Then, V5=V5'=V6=V6'=E. Due to the presence of the diodes DC' and DL', the potential V8' is included between E/2 and E, so that the voltage VC' at the terminals of capacitor C' is included between E/2 and 0. If diode DC' is conductive at the end of opening of the transistor T, L1' may discharge and VC'=−E/2. Similarly, due to the presence of diodes DC and DL, potential V8 is included between 0 and E/2, so that the voltage VC at the terminals of capacitor C is between E/2 and E.

If generator G now controls transistor T upon closure, the potential V5 passes suddenly from E to O. The current ICE passing through transistor T is equal to the difference of the current IL2 passing through inductance L2 and the current IC of capacitor C. This current IC is easy to analyse, since, as in the case of FIG. 1, there is a half-period of oscillating circuit LIC through DC and T, at the end of which the voltage VC is inverted. The current IL2 is more difficult to analyse and analysis thereof is aided by diagrams a and b of FIG. 5, showing respectively the current IL2' and the voltage −VC'. In fact, there are three successive phases.

In a first phase (from $t_9$ to $t_{10}$) transistor T and diode DT' conduct and V5'=E and V5=0. Consequently, the current IDT' passing through diode DT' is equal to the opposite of current IL2' passing through the inductance L2': this current IDT' decreases linearly from 1 to 0, whilst current IL2 increases linearly from 0 to 1. During this period, as assumed hereinabove, VC'=−E/2.

At instant $t_{10}$, diode DT' then blocks, but diode DC' unblocks. A half-period 10 of series oscillating circuit C'-L2-L2' appears through DC', T and the half source E/2 included between pole n and point 7 with, for initial conditions, a zero current and a voltage E.

At end $t_{11}$ of oscillation 10, diode DC' blocks and the voltage VC' reaches a high value, of the order of (3E/2) (ignoring the losses), which brings about deblocking of DL' as soon as DC' is extinguished.

There follows a new half-period 11 of oscillating circuit (with for initial conditions a zero current and a voltage (3E/2)−E=(E/2) between the capacitor C' and the inductances L1', L2 and L2' in series, through the diode DL', the transistor T and the two half-sources E/2. The corresponding current is subtracted from current I in the transistor T. When DL' is blocked (instant $t_{12}$), the voltage VC' takes a value close to E/2.

The total duration of switching of closure ($t_{12}$-$t_9$) is therefore imposed by the current $IL_2'$ and is equal to $$I \times \frac{L2 + L2'}{E} + \pi \sqrt{C'(L2 + L2')} + \pi \sqrt{C'(L1' + L2 + L2')}$$

The over-current in transistor T is more difficult to assess. That due to the inversion of the capacitor C (and which bears reference 12 in diagram d of FIG. 5) must be distinguished from that due to the inversion of capacitor C' (and which bears reference 13 in diagram d of FIG. 5). These inversions are produced at different instances and diagrams d of FIG. 5 show an example. It should be noted in particular that the following opening of transistor T may occur as soon as the voltage VC reaches value $-E/2$, without awaiting the inversion of VC', i.e. after a fairly short time.

The shape of the current ICE may vary widely depending on the respective values of E, I, C', L1, L2, L1' and L2'.

FIG. 6 shows an example of application to a push-pull converter of the snubber according to the invention.

In known manner, such a push-pull converter comprises a transformer provided with two primary windings P1 and P2 coupled to a secondary winding S. Each of the primary windings P1 and P2 is mounted in parallel on a D.C. source E, respectively via a controlled switch (for example transistor) T1 or T2. The conduction of each transistor T1 and T2 is controlled by the base thereof, connected to pulse generators G1 or G2. In the example shown, free wheel diodes D1 and D2 are provided "at the primary winding", respectively in parallel on the transistors T1 and T2. A load (not shown) is supplied by the secondary winding S.

As shown in FIG. 6, each link between a primary winding P1 or P2 and the corresponding transistor T1 or T2 has been opened to insert therein the inductance L21 or L22 (terminals 51, 52 and 61, 62) of a snubber according to the invention, respectively bearing reference CAC1 or CAC2. The various elements of circuits CAC1 and CAC2 bear the references of the corresponding elements of circuit CAC of FIG. 1, followed by the index 1 or 2 depending on whether they belong to CAC1 or CAC2. Moreover, the terminal 31 or 32 of each circuit CAC1 and CAC2 is connected to the end of the corresponding primary circuit P1 or P2, opposite the transistor T1 or T2. Finally, terminal 41 of 42 of each circuit CAC1 and CAC2 is connected to the end of the corresponding transistor T1 or T2, opposite inductance L21 or L22.

In operation, the emitter-collector voltage pulses of transistors T1 and T2 are known to present amplitudes VCE1 and VCE2 which are equal to twice the value of the voltage E.

The working of the push-pull converter of FIG. 6 equipped with the circuits CAC1 and CAC2 according to the invention will be analysed hereinafter in relation to the state of the transistor T1. It goes without saying that the analysis is symmetrical as a function of the state of the transistor T2.

In the initial state, only transistor T1 is conductive, whilst transistor T2 is blocked and the same applies to the different diodes DL1, DC1, D1 and DL2, DC2, D2. The primary current I giving rise to the charge current is, (which is proportional thereto in the ratio of the transformer) flows through L21 and T1. Consequently, the potentials V51 and V61 at the terminals 51 and 61 are equal to each other and zero. On the other hand, the potentials V52 and V62 of the terminals 52 and 62 are both equal to 2E. The voltage VC2 at the terminals of the capacitor C2 is included between E and 2E, whilst the voltage VC1 at the terminals of the capacitor C1 is equal to $-E$, as diode DC1 was conductive at the end of the last switching.

When opening of transistor T1 is controlled by generator G1, it cancels its emitter-collector current ICE1. The current of inductance L21 flows through L21, C1 and DC1, the capacitor C1 protecting transistor T1 by limiting the linear growth of VCE1. Correlatively, V51 and V61 increase whilst remaining equal, whilst the voltage V at the terminals of the primary winding P1, V52, V62 and VD2 (voltage at the terminals of diode D2) decrease until diode DC2 is energized. At that instant, $V = VC2 - E = -VL1$, so that the sum of voltages VC1 and VC2 at the terminals of capacitors C1 and C2 is equal to E, VC2 being unchanged. The primary current is then divided between L21 and L22 with IL21 − IL22 constant and proportional to IS and therefore VL21 = VL22. Everything occurs as in the device of FIG. 4, the current being divided between the two circuits L21, C1, DC1 and L22, C2, DL2 and L12 in parallel.

The following equalities are then had:

$$VC1 + VL21 + V = 0$$

$$-VL12 + VC2 + VL22 - V = E$$

so that $$VC1 + VC2 + 2VL21 - VL12 = E$$

and $$VC1 - VC2 + 2V + VL12 = -E.$$

Several cases of operation are then possible depending on the order in which the extinctions of DC1 and DL2 and the energization of DE are produced, the phenomenon being able to be accelerated by energization of transistor T2.

An intermediate state is therefore attained for which diode D2 is conductive, all the other diodes and transistors T1 and T2 being blocked, current I flowing through L22 and D2. Then, $$V62 = V52 = 0$$

$$V61 = V51 = 2E$$

$$VC2 = -E$$

$$E \leq VC_1 \leq 2E.$$

When the generator G1 controls transistor T1, the current ICE1 of this transistor is equal to IL21 − IC1. The current IC1 of capacitor C1 results from a half-period of oscillation of the oscillating circuit L11-C1 at the end of which $VC1 = -E$ (with brief conduction of DC1 at the end).

The current IL21 develops in three stages.

(a) linear decrease of $ID2 = -IL22$, from I to zero, IL21 increasing from zero to I, this decrease being terminated by the blocking of D2;

(b) energization of DC2; the coupling of the two primary windings P1 and P2 then places L21 and L22 in series and everything occurs as for the device of FIG. 4. In fact, $$E = VL21 + V$$

$$0 = VC2 + VL22 - V$$

hence $$E = VC2 + VL21 + VL22$$

At the start, $VC2 = -E$. At the end of a half-period, VC2 attains a theoretical value of 3E. At the end, DC2 is blocked.

(c) DL2 energizes immediately and, as before, the coupling of the primary windings places L12, L21, L22 and C2 in series. As in the device of FIG. 4, there is another half-period of oscillating circuit at the end of which $VC2 = E$.

In the device of FIG. 6, the switches T1 and T2 are disposed towards the negative pole n of source E. In the variant of FIG. 7, (in which the elements corresponding to FIG. 6 are followed by a prime), the switches T'1 and T'2 are disposed towards the positive pole p. The circuits CAC'1 and CAC'2 are consequently modified and are similar to circuit CAC' of FIG. 3.

FIG. 8 illustrates a device similar to that of FIG. 6, in which the inductances L21 and L22 are replaced by the leakage inductances existing between the two primary windings P1 and P2. These leakage inductances may be of the order of some micro-Henrys, with the result that they may act as inductances L21 and L22.

Furthermore, there may also be a leakage inductance existing between the secondary winding S and the two primary windings P1 and P2. This latter leakage inductance may be of the order of some milli-Henrys and it may replace the series-inductance of the power filter, generally disposed in the circuit of the secondary winding S.

To obtain these different leakage inductances, the primary windings P1 and P2 and the secondary winding S are coiled separately, which, taking into account the different numbers of turns, facilitates production and ensures an excellent galvanic insulation.

The generator G1-G2 for controlling the transistors T1 and T2 advantageously ensures a modulation of the cyclic ratio at the working frequency. To this end, the conduction pulses A and A sent by the generator G1-G2 on the bases of the transistors T1 and T2 may result from the chop of a voltage of 50 KHz by a triangular signal of fixed frequency, for example 5 KHz. Numerous values of cyclic ratio may thus be scanned and the snubber circuit according to the invention presenting, as has been mentioned hereinabove, excellent compromises upon opening and closure, may function with minimum opening and closure times which are as short as possible.

The device of FIG. 8 presents decisive advantages, for making a D.C.-A.C. converter with galvanic insulation, such as considerable simplicity, excellent reliability, low cost price, high yield and excellent quality of the current furnished to the charge.

In particular, the reversibility of the energy from one switching aid circuit to the other facilitates servo-controls and protections and considerably reduces the transitory phenomena.

Although the foregoing description concerns the application of the present invention to certain particular converter structures, it goes without saying that it is not limited thereto.

It will be readily understood that the switching aid circuit according to the invention may be applied both to a single bridge structure of switches with double source (as for example in FIG. 4) and to a double or polyphase bridge structure of switches with single or double source. Similarly, it is applicable to all push-pull converter structures and to that of insulated converters, symmetrical or asymmetrical, with free wheel diode at the primary winding or secondary winding.

What is claimed is:

1. In a non-dissipative snubber circuit adapted for use in a power switching circuit of the type including a source of D.C. voltage, at least one controlled switch, a main inductance connected directly to said switch adapted to protect said switch during closure thereof, a load having a free wheel diode associated therewith, said switch, main inductance and load being connected in series across said source, and a capacitor adapted to protect said switch during opening thereof, the improvement comprising a branch circuit including said capacitor, a first diode and an auxiliary inductance in series, mounted in parallel across said switch, with a first terminal of said capacitor connected directly to the junction of said controlled switch and said main inductance;

a second diode connected between the second terminal of said capacitor and a point of substantially fixed potential provided by means associated with said voltage source, said fixed potential being higher or lower than the potential applied to the end of said controlled switch opposite said main inductance, according to whether said latter potential is negative or positive respectively;

said first and second diodes being poled to be blocking with respect to the D.C. voltage applied by said source to the branch circuit including said diodes and said auxiliary inductance in series.

2. The circuit of claim 1 wherein said load includes transformer means connected in series with said switch, and said main inductance comprises leakage inductance of said transformer means.

3. The circuit of claim 1 wherein said power switching circuit includes a plurality of controlled switches, each of which has associated therewith said main inductance, said auxiliary inductance, and said first and second diodes.

4. The circuit of claim 1, wherein said point of substantially fixed potential to which the capacitor is connected by the second diode is such that its potential corresponds to half of the voltage withstood by the switch.

5. The circuit of claim 4 adapted for use in a push-pull converter, wherein said point of substantially fixed potential is the terminal of the D.C. source opposite the terminal thereof to which is connected the end of the controlled switch opposite the main inductance.

6. The circuit of claim 4, wherein said point of substantially fixed potential is constituted by the centre point of the source E.

* * * * *